United States Patent
Park et al.

(10) Patent No.: US 8,872,059 B2
(45) Date of Patent: Oct. 28, 2014

(54) ETCHING SYSTEM AND METHOD OF CONTROLLING ETCHING PROCESS CONDITION

(75) Inventors: Sang-Wuk Park, Osan-si (KR); Geum-Jung Seong, Seoul (KR); Kye-Hyun Baek, Suwon-si (KR); Yong-Jin Kim, Suwon-si (KR); Chan-Mi Lee, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 505 days.

(21) Appl. No.: 13/220,084

(22) Filed: Aug. 29, 2011

(65) Prior Publication Data

US 2012/0055908 A1 Mar. 8, 2012

(30) Foreign Application Priority Data

Sep. 6, 2010 (KR) .......................... 10-2010-0087071

(51) Int. Cl.
*B23K 26/03* (2006.01)
*B23K 26/04* (2014.01)
*H01L 21/00* (2006.01)
*B23K 26/06* (2014.01)
*H01L 21/66* (2006.01)
*H01J 37/32* (2006.01)
*B23K 26/36* (2014.01)

(52) U.S. Cl.
CPC ............ *B23K 26/0661* (2013.01); *H01L 22/26* (2013.01); *B23K 26/032* (2013.01); *H01J 37/32972* (2013.01); *H01L 22/12* (2013.01); *B23K 26/365* (2013.01)
USPC ................................ 219/121.62; 219/121.68

(58) Field of Classification Search
CPC .... B23K 26/033; B23K 26/032; B23K 26/04; B23K 26/365
USPC ............... 219/121.68, 121.69, 121.6–121.62, 219/121.83, 121.85
See application file for complete search history.

(56) References Cited

U.S. PATENT DOCUMENTS

2002/0142613 A1 * 10/2002 Fu et al. ......................... 438/719

FOREIGN PATENT DOCUMENTS

| JP | 2001085388 | A |   | 3/2001 |
|----|------------|---|---|--------|
| JP | 2001343219 | A |   | 12/2001 |
| JP | 2002313779 | A | * | 10/2002 |
| JP | 2004363367 | A |   | 12/2004 |
| JP | 2009194356 | A |   | 8/2009 |

* cited by examiner

*Primary Examiner* — Samuel M Heinrich
(74) *Attorney, Agent, or Firm* — Harness, Dickey & Pierce, P.L.C.

(57) ABSTRACT

Provided is an etching system and a method of controlling etching process condition. The etching system includes a light source that irradiates incident light into a target wafer, a light intensity measuring unit that measures light intensity according to the wavelength of interference light generated by interference between reflected light beams from the target wafer, a signal processor that detects a time point at which an extreme value in the intensity is generated when the intensity of interference light varies according to the wavelength, and a controller that compares the extreme value generating time point detected from the signal processor with a reference time point corresponding to the extreme value generating time point and controls a process condition according to the comparison result.

20 Claims, 8 Drawing Sheets

ETCHING SYSTEM AND METHOD OF CONTROLLING ETCHING PROCESS CONDITION

CROSS-REFERENCE TO RELATED APPLICATION

This application claims priority under 35 U.S.C. §119 to Korean Patent Application No. 10-2010-0087071 filed on Sep. 6, 2010 in the Korean Intellectual Property Office (KIPO), the entire contents of which are herein incorporated by reference.

BACKGROUND OF THE INVENTION

1. Field

Example embodiments relate to an etching system and a method of controlling etching process conditions.

2. Description of the Related Art

In the manufacture of a semiconductor device, an etching process is performed, on a wafer using a mask pattern to form trenches or recesses on a to-be-etched layer. During the etching process, a portion of the to-be-etched layer that is not covered by the mask pattern may be physically etched.

SUMMARY

Example embodiments provide an etching system, which may uniformly control a depth of a recess formed by etching.

Example embodiments also provide a method of controlling etching process conditions, by which a depth of a recess formed by etching may be uniformly controlled.

These and other objects of example embodiments will be described in or be apparent from the following description.

In accordance with example embodiments, an etching system may include a light source configured to irradiate incident light into a target wafer, a light intensity measuring unit configured to measure intensities of interference light, a signal processor configured to detect a time point at which an extreme value in the intensities is generated, and a controller configured to compare the time point detected by the signal processor with a reference time point corresponding to the time point detected by the signal processor and control a process condition according to the comparison result. In example embodiments, the interference light may be generated from light beams reflected from the target wafer when the incident light is irradiated thereon and the interference light may have a wavelength.

In accordance with example embodiments, an etching system may include a light source configured to irradiate incident light into a target wafer, a light intensity measuring unit configured to measure light intensity according to a wavelength of interference light generated by interference between reflected light beams from the target wafer, a signal processor configured to detect a first time point at which a first extreme value in an intensity of first interference light having a first wavelength is generated and a second time point at which a second extreme value in an intensity of second interference light having a second wavelength different from the first wavelength is generated, and a controller configured to compare a time difference between the first and second time points with corresponding reference time points and control a process condition according to the comparison result.

In accordance with example embodiments, a method of controlling an etching process condition may include detecting a time point associated with an extreme intensity value of interference light, the interference light being generated by interference of light reflecting from an interface between a to-be-etched layer and a mask pattern and light reflecting from a surface of the to-be-etched layer exposed by the mask pattern, and comparing the time point associated with the extreme intensity value with a reference time point, and controlling a process condition according to the comparison result.

In accordance with example embodiments, an etching system may include a light source configured to irradiate light into a target wafer, a light intensity measuring unit configured to measure light intensity of at least one interference light generated by reflected light beams from the target wafer, a signal processor configured to detect a time point corresponding to an extreme value of light intensity of the at least one interference light, and a controller configured to compare the time point corresponding to, the extreme value of light intensity detected from the signal processor with a second time point and control a process condition according to the comparison result.

In accordance with example embodiments, an etching system may include a light source that irradiates incident light into a target wafer, a light intensity measuring unit that measures light intensity according to the wavelength of interference light generated by interference between reflected light beams from the target wafer, a signal processor that detects a time point at which an extreme value in the intensity is generated when the intensity of interference light varies according to the wavelength, and a controller that compares the extreme value generating time point detected from the signal processor with a reference time point corresponding to the extreme value generating time point and controls a process condition according to the comparison result.

In accordance with example embodiments, an etching system may include a light source that irradiates incident light into a target wafer, a light intensity measuring unit that measures light intensity according to the wavelength of interference light generated by interference between reflected light beams from the target wafer, a signal processor that detects a time point at which a first extreme value in the intensity of first interference light having a first wavelength is generated and a time point at which a second extreme value in the intensity of second interference light having a second wavelength different from the first wavelength is generated, and a controller that compares a time difference between the first and second extreme value generating time points with corresponding reference time points and controls a process condition according to the comparison result.

In accordance with example embodiments, a method of controlling etching process condition may include detecting an extreme value generating time point in the intensity of the interference light generated by interference between reflected light at an interface of the to-be-etched layer and the mask pattern and reflected light on a surface of the to-be-etched layer exposed by the mask pattern, and comparing the extreme value generating time point in the intensity of the interference light with a reference time point and controlling a process condition according to the comparison result.

BRIEF DESCRIPTION OF THE DRAWINGS

The above and other features and advantages of the present invention will become more apparent by describing, in detail, example embodiments thereof with reference to the attached drawings in which.

DETAILED DESCRIPTION

Figure 1:
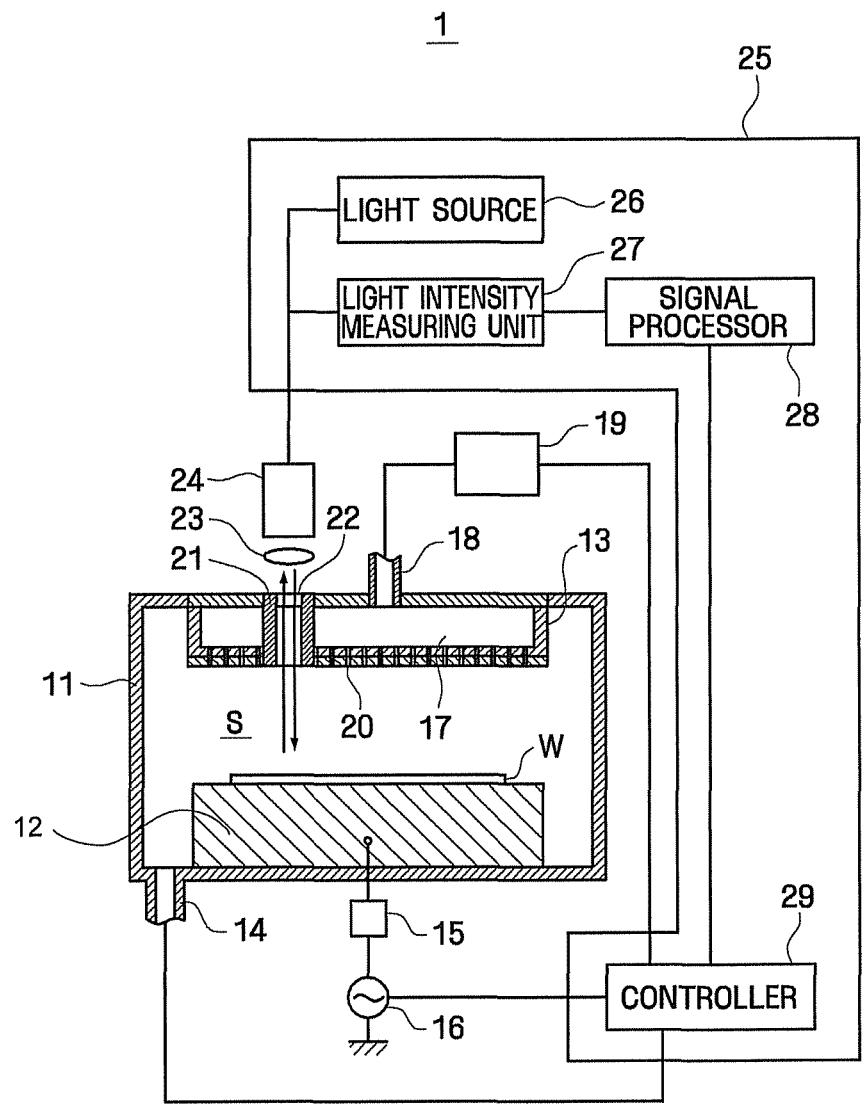
FIG. 1 is a cross-sectional view schematically illustrating an etching system according to example embodiments.

Advantages and features of the present invention and methods of accomplishing the same may be understood more readily by reference to the following detailed description of example embodiments and the accompanying drawings. The present invention may, however, be embodied in many different forms and should not be construed as being limited to example embodiments as set forth herein. Rather, example embodiments are provided so that this disclosure will be thorough and complete and will fully convey the concept of the invention to those skilled in the art, and the present invention will only be defined by the appended claims. In the drawings, the thickness of layers and regions are exaggerated for clarity.

It will be understood that when an element or layer is referred to as being "on," or "connected to" another element or layer, it can be directly on or connected to the other element or layer or intervening elements or layers that may be present. In contrast, when an element is referred to as being "directly on" or "directly connected to" another element or layer, there are no intervening elements or layers present.

Like numbers refer to like elements throughout. As used herein, the term "and/or" includes any and all combinations of one or more of the associated listed items.

The terminology used herein is for the purpose of describing example embodiments only and is not intended to be limiting of the invention. As used herein, the singular forms "a", "an" and "the" are intended to include the plural forms as well, unless the context clearly indicates otherwise. It will be further understood that the terms "comprises" and/or "made of," when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of example embodiments.

Example embodiments described herein will be described referring to plan views and/or cross-sectional views by way of ideal schematic views. Accordingly, the exemplary views may be modified depending on manufacturing technologies and/or tolerances. Therefore, example embodiments are not limited to those shown in the views, but include modifications in configuration formed on the basis of manufacturing processes. Therefore, regions exemplified in figures have schematic properties and shapes of regions shown in figures exemplify specific shapes of regions of elements and not limit aspects of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

An etching system according to example embodiments will now be described with reference to FIG. 1. FIG. 1 is a cross-sectional view schematically illustrating an etching system according to example embodiments.

Referring to FIG. 1, an etching system 1 according to example embodiments may include a process chamber 11 made of a conductive material, for example, aluminum. A lower electrode 12 serving as a stage on which a target wafer W is positioned may be formed on a bottom of the process chamber 11. A shower head 13 spaced part from the lower electrode 12 may be installed above a top portion of the lower electrode 12.

An exhaust unit 14 connected to a vacuum pumping equipment (not shown) may be formed at a lower portion of the process chamber 11. As shown in FIG. 1, a power source 16 may be connected to the lower electrode 12 through a matching device 15. A process gas inlet pipe 18 may be installed in a buffer chamber 17 placed in the shower head 13 to then be connected to a process gas supply apparatus 19. The shower head 13 may have a plurality of gas holes 20. A process gas induced into the buffer chamber 17 from the process gas inlet pipe 18 may be supplied to a process space S through the plurality of gas holes 20.

In example embodiments, the internal pressure of the process chamber 11 may be reduced by the exhaust unit 14 until a degree of vacuum is reached. In example embodiments, the degree of vacuum may or may not be predetermined. Then, in a state in which a voltage is applied from the lower electrode 12 to the process space S, the process gas is supplied from the shower head 13 to the process space S, and plasma is generated from the process space S using the process gas. In example embodiments, the generated plasma may collide with and contact the target wafer W, thereby etching the target wafer W.

A monitoring unit 21 for observing the target wafer W disposed on the lower electrode 12 may be installed in the shower head 13 of the process chamber 11. The monitoring unit 21 may be formed of a cylindrical member that passes through the shower head 13. A monitoring window 22 made of a transparent material, for example, quartz or glass, may be provided at a top end of the monitoring unit 21. In addition, a focusing lens 23 and an optical fiber 24 may be located to correspond to the monitoring unit 21 at an upper portion of the monitoring unit 21.

The optical fiber 24 may be connected to an etching controlling apparatus 25 for controlling an etching process condition of the target wafer W. The etching controlling apparatus 25 may include a light source 26 for irradiating incident light into the target wafer W, a light intensity measuring unit 27 for measuring an intensity of interference light generated by interference between reflected light beams reflected from the target wafer W according to the wavelength, a signal processor 28 for detecting an extreme value generating time point in the intensity of the interference light when the intensity interference light varies according to the wavelength, and a controller 29 for comparing the extreme value generating time point detected by the signal processor 28a to a reference time point and controlling a process condition according to the comparison result.

The light source 26 may be a monochromatic or polychromatic light source that generates light having intensity high enough to generate light beams reflected from the target wafer W with a measurable intensity. For example, the light source 26 may be a monochromatic light source, for example, a helium-neon (He—Ne) laser or neodymium-yttrium aluminum garnet (ND-YAG) laser. Alternatively, the light source 26 may be a polychromatic light source, for example, a xenon (Xe) lamp or a mercury-cadmium (Hg—Cd) lamp. In a case where the light source 26 is a polychromatic light source, the polychromatic light source may filter only incident light having a selected wavelength to be incident into the process chamber 11. Alternatively, a color filter may be disposed in front of the light intensity measuring unit 27 to filter reflected light having an unwanted wavelength out of the reflected light applied to the light intensity measuring unit 27. The incident light generated from the light source 26 may be irradiated into the target wafer W through the optical fiber 24, the focusing lens 23, the monitoring window 22, and the monitoring unit 21.

If the light irradiated into the target wafer W is reflected from surfaces of target wafers W having different heights, a plurality of reflected light beams are generated. The plurality of reflected light beams interfere each other, thereby generating interference light. The interference light may be incident into the light intensity measuring unit 27 through the optical fiber 24. The light intensity measuring unit 27 measures the intensity of the interference light according to the wavelength.

The intensity of the interference light has extreme values, that is, a maximal value and a minimal value due to constructive interference or destructive interference between the reflected light beams. The signal processor 28 may be configured to detect time points at which the maximal value and the minimal value in the intensity of the interference light are generated.

The controller 29 may be configured to compare the maximal or minimal value generating time point detected from the signal processor 28 with a reference time point corresponding to the extreme value generating time point and control a process condition according to the comparison result. In example embodiments, the controller 29 may be connected to various components of the etching system 1 and may control operations of the components. The controller 29 may be connected to, for example, a power supply 16, a process gas supply apparatus 19, an exhaust unit 14, however, example embodiments are not limited thereto as the controller 29 may be connected to all components associated with the process condition.

A method of controlling etching process condition using the etching controlling apparatus 25 will later be described.

Figure 2:
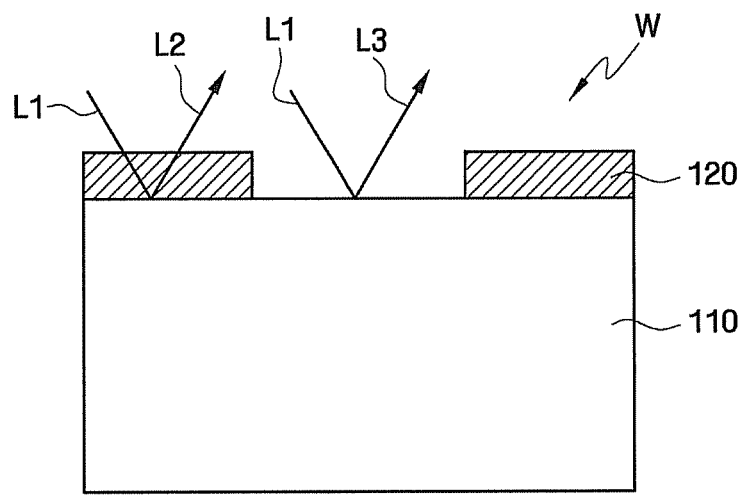
FIG. 2 illustrates reflected light beams forming interference light used for an etching controlling apparatus.

A method of controlling an etching process condition using an etching controlling apparatus of the etching system according to example embodiments will now be described with reference to FIGS. 1 to 8. FIG. 2 illustrates reflected light beams forming interference light used by an etching controlling apparatus, and FIGS. 3 to 8 illustrate a method of uniformly controlling etching process condition depths in etching target wafers having mask patterns of different thicknesses.

In example embodiments, the target wafer W may include a mask pattern 120 formed on a to-be-etched layer 110 as shown in FIG. 2. The to-be-etched layer 110 may be exposed by the mask pattern 120 and the to-be-etched layer 110 may be etched using he mask pattern 120 as an etch mask.

Referring to FIGS. 1 and 2, in the etching controlling apparatus 25 of the etching system 1 shown in FIG. 1, when etching of the to-be-etched layer 110 starts, incident light L1 from a light source 26 is irradiated into a target wafer W. Part of the incident light L1 may be transmitted through a mask pattern 120 and is reflected as first reflected light L2 at an interface between the mask pattern 120 and the to-be-etched layer 110. In addition, another part of the incident light L1 is reflected as second reflected light L3 at a surface of the to-be-etched layer 110 exposed by the mask pattern 120. The first reflected light L2 and the second reflected light L3 may interfere with each other to generate interference light.

From the viewpoint of depth uniformity of etching, the depth ranging from the interface between the mask pattern 120 and the to-be-etched layer 110 to an etched location should be uniformly controlled. Therefore, in example embodiments, interference light of the first reflected light L2 and the second reflected light L3 may be used at the interface between the mask pattern 120 and the to-be-etched layer 110 and at the surface of the to-be-etched layer 110 exposed by the mask pattern 120, respectively. The incident light L1 may be reflected from a top surface of the mask pattern 120, forming reflected light. However, interference light of the reflected light and the second reflected light L3 may become a noise signal. Therefore, a wavelength, in which the maximum reflectance level is exhibited at the surface of the to-be-etched layer 110 and the interface between the mask pattern 120 and the to-be-etched layer 110, may be used as a wavelength of the incident light L1. For example, a wavelength, in which the reflectance levels at the surface of the to-be-etched layer 110 and at the interface between the mask pattern 120 and the to-be-etched layer 110 are much higher than the reflectance level at the surface of the mask pattern 120.

As a depth increases, the depth ranging from the interface between the mask pattern 120 and the to-be-etched layer 110 to the surface of the to-be-etched layer 110 exposed by the mask pattern 120 to then be etched, during etching, the intensity in the interference light of the first reflected light L2 and the second reflected light L3 may vary. The intensity in the interference light may be measured according to the wavelength by the light intensity measuring unit 27 of the etching controlling apparatus 25. In example embodiments, the signal processor 28 may determine a time point at which a differential value of the intensity of the interference light with respect to the time point becomes zero (0) as the extreme value in the intensity of the interference light.

Even if the reflected light L2 and the reflected light L3 are reflected from the surface of the to-be-etched layer 110 having the same height, the reflected light L2 uses the mask pattern 120 as a medium, while the reflected light L3 uses vacuum as a medium. Since the refractive index is lowest in vacuum, a point at which a light path difference between the reflected light L2 and the reflected light L3 becomes zero (0) for the first time is the point at which a height of the surface of the to-be-etched layer 110 exposed by the mask pattern 120 and etched is lower than a height of the interface between the mask pattern 120 and the to-be-etched layer 110. When the light path difference between the reflected light L2 and the reflected light L3 becomes zero (0), the reflected light L2 and the reflected light L3 have the same phase. As the result, the interference light of the reflected light L2 and the reflected light L3 has the maximum value in the intensity.

Even if the process condition, including a thickness of the mask pattern 120 or etch rate for each target wafer W, varies, the depth ranging from the interface between the mask pattern 120 and the to-be-etched layer 110 to the surface of the to-be-etched layer 110 exposed by the mask pattern 120 to then be etched is equal for each target wafer W at a time point of generating an extreme value in the intensity of the interference light. Therefore, at the time point of generating the first maximal value in the intensity of the interference light of the first reflected light L2 and the second reflected light L3, the depth ranging from the interface between the mask pattern 120 and the to-be-etched layer 110 and the surface of the to-be-etched layer 110 exposed by the mask pattern 120 and etched is equal for each target wafer W. Based on this finding, as shown in FIGS. 3 to 8, even if mask patterns of the respective target wafers have different thicknesses, depths of a recess varying due to the thickness of the mask pattern after etching is terminated can be controlled in a real time basis.

Figure 3:
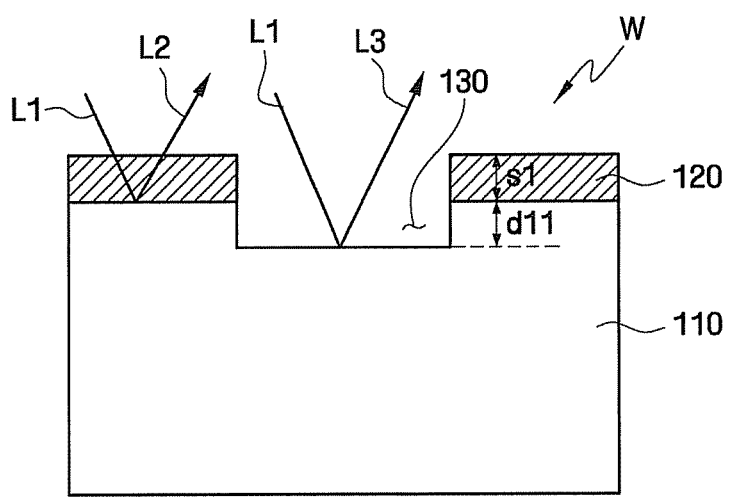
FIG. 3 is a cross-sectional view of a target wafer to be processed in an etching process that is used as a reference in controlling etching process conditions.
Figure 4:
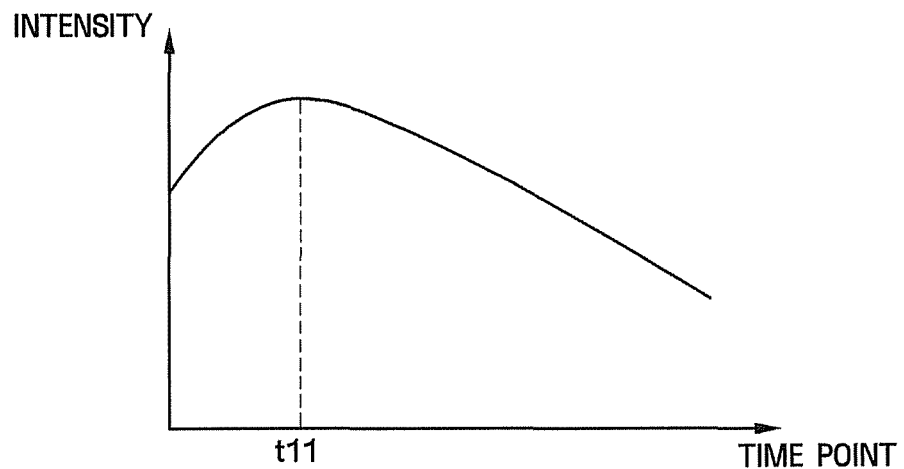
FIG. 4 is a graph illustrating a change in the intensity of interference light over time in etching the target wafer shown in FIG. 3.

FIG. 3 is a cross-sectional view of a target wafer to be processed in an etching process that may be used as a basis in controlling etching process condition, and FIG. 4 is a graph illustrating a change in the intensity of interference light beam over time in etching the target wafer shown in FIG. 3.

In example embodiments, the target wafer W may include the mask pattern 120 formed on the to-be-etched layer 110, as shown in FIG. 3. In example embodiments, an etching of the to-be-etched layer 110 exposed by the mask pattern 120 may be started using the mask pattern 120 as an etch mask. Thus, a recess 130 may be formed on the top surface of the to-be-etched layer 110. In FIG. 3, s1 denotes a thickness of the mask pattern 120, which becomes a basis thickness of the mask pattern 120.

Referring to FIGS. 1, 3 and 4, the signal processor 28 detects a time point at which an extreme value in the intensity of the interference light of the first reflected light L2 and the second reflected light L3 is generated.

A time point detected by the signal processor 28, at which a first maximal value in the intensity of the interference light is generated, is t11. At this time point, a depth ranging from the interface between the mask pattern 120 and the to-be-etched layer 110 to a bottom surface of the recess 130 is denoted by d11. Here, t11 becomes a reference time point for the time point at which the first maximal value in the intensity of the interference light is generated. When etching is continued for a predetermined duration of time after t11 as the reference time point until a desired depth is reached, the etching is terminated. A time point at which the etching is terminated is denoted by t_end, which is used as the reference time point for an etching endpoint.

Figure 5:
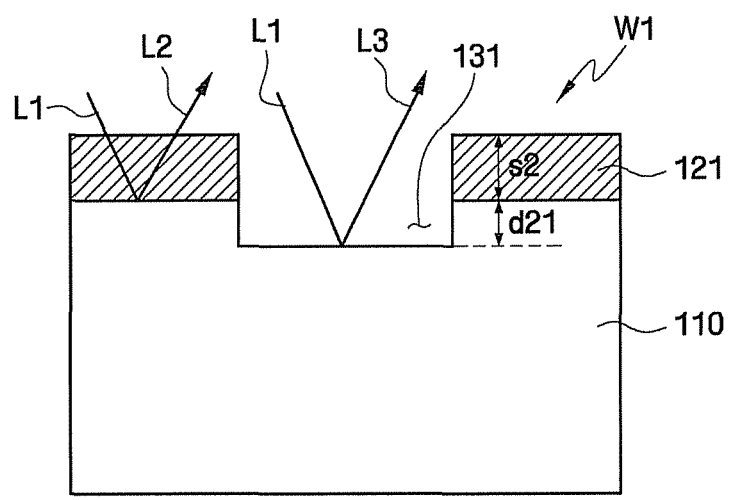
FIG. 5 is a cross-sectional view illustrating a target wafer having a mask pattern thicker than a mask pattern shown in FIG. 3.
Figure 6:
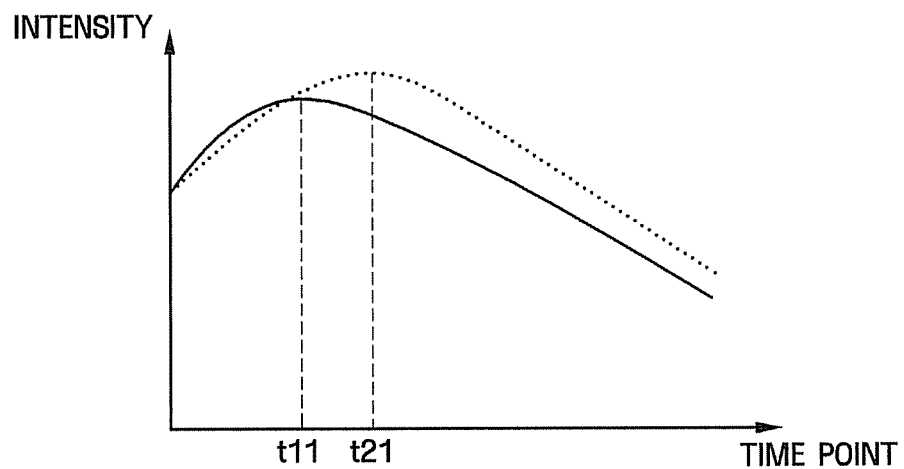
FIG. 6 is a graph illustrating a change in the intensity of interference light over time in etching the target wafer shown in FIG. 5.

FIG. 5 is a cross-sectional view illustrating a target wafer having a mask pattern thicker than a mask pattern shown in FIG. 3, and FIG. 6 is a graph illustrating a change in the intensity of interference light over time in etching the target wafer shown in FIG. 5.

In example embodiments, the target wafer W1 may include a mask pattern 121 formed on the to-be-etched layer 110, as shown in FIG. 5. In example embodiments, a thickness of the mask pattern 121 is s2, which may be greater than s1. In example embodiments, an etching of the to-be-etched layer 110 exposed by the mask pattern 121 may be started using the mask pattern 121 as an etch mask, thus, a recess 131 may be formed on the top surface of the to-be-etched layer 110.

Referring to FIGS. 1, 5 and 6, the signal processor 28 detects a time point at which an extreme value in the intensity of the interference light of the first reflected light L2 and the second reflected light L3 is generated. A time point of generating a first maximal value in the intensity of the interference light is t21, as detected by the signal processor 28. At this time point, a depth ranging from the interface between the mask pattern 121 and the to-be-etched layer 110 to a bottom surface of the recess 131 is represented by d21. Here, d21 and d11 of FIG. 3 are equal to each other irrespective of thicknesses of the mask patterns 120 and 121. With regard to the mask pattern 121 having a thickness greater than a reference thickness, the time point t21 at which the first maximal value in the intensity of the interference light is generated is behind the reference time point t11 at which the first maximal value in the intensity of the interference light is generated.

If a total etching time of the target wafer (W of FIG. 3) is equal to a total etching time of the target wafer W1, the depth of the recess 131 formed in the target wafer W1 after the etching endpoint should be less than the depth of the recess 130 formed in the target wafer W. Accordingly, in order to compensate for a difference in the etching depth due to a thickness difference between the mask patterns 120 and 121, it may be necessary to make the etching endpoint of the target wafer W1 be behind a reference time point.

In the etching of the target wafer W1, the signal processor 28 detects the first maximal value generation time point 121 in the intensity of the interference light, and the controller 29 compares 121 with the reference time point t11. If it is determined that t21 is behind t11, the controller 29 adjusts an etching process time of the target wafer W1 such that the etching of the target wafer W1 is terminated at a time point obtained by summing the reference time point t_end for the etching endpoint of the target wafer W and a time difference between the first maximal value generating time point t21 and the reference time point t11. Accordingly, after the etching is terminated, the depths of the recesses 130 and 131 of the target wafer W and the target wafer W1 may become equal to each other.

Figure 7:
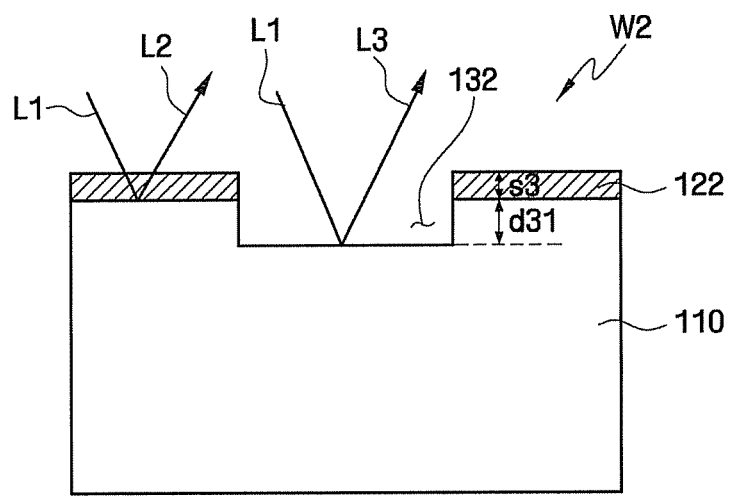
FIG. 7 is a cross-sectional view illustrating a target wafer having a mask pattern thinner than a mask pattern shown in FIG. 3.
Figure 8:
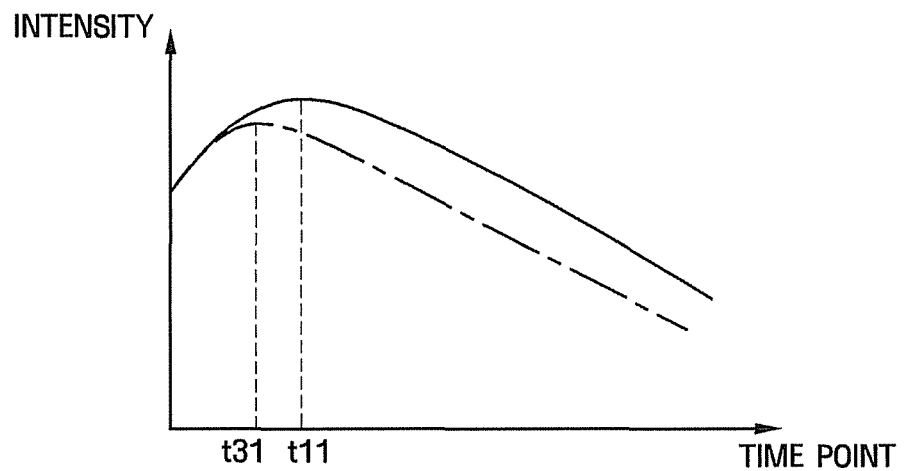
FIG. 8 is a graph illustrating a change in the intensity of interference light over time in etching the target wafer shown in FIG. 7.

FIG. 7 is a cross-sectional view illustrating a target wafer having a mask pattern thinner than a mask pattern shown in FIG. 3, and FIG. 8 is a graph illustrating a change in the intensity of interference light over time in etching the target wafer shown in FIG. 7.

In example embodiments, the target wafer W2 may include a mask pattern 122 formed on the to-be-etched layer 110, as shown in FIG. 7. A thickness of the mask pattern 122 is s3, which may be smaller than s1. In example embodiments, an etching of the to-be-etched layer 110 exposed by the mask pattern 122 may be started using the mask pattern 122 as an etch mask. Thus, a recess 132 may be formed on the top surface of the to-be-etched layer 110.

Referring to FIGS. 1, 7 and 8, the signal processor 28 detects a time point at which an extreme value in the intensity of the interference light of the first reflected light L2 and the second reflected light L3 is generated. A time point of generating a first maximal value in the intensity of the interference light is 131, as detected by the signal processor 28. At this time point, a depth ranging from the interface between the mask pattern 122 and the to-be-etched layer 110 to a bottom surface of the recess 132 is represented by d31. Here, d31 and d11 of FIG. 3 are equal to each other irrespective of thicknesses of the mask patterns 120 and 122. With regard to the mask pattern 122 having a thickness smaller than a reference thickness, the time point t31 at which the first maximal value in the intensity of the interference light is generated is behind the reference time point t11 at which the first maximal value in the intensity of the interference light is generated.

If a total etching time of the target wafer (W of FIG. 3) is equal to a total etching time of the target wafer W2, the depth of the recess 132 formed in the target wafer W2 after the etching endpoint should be greater than the depth of the recess 130 formed in the target wafer W. Accordingly, in order to compensate for a difference in the etching depth due to a thickness difference between the mask patterns 120 and 122, it may be necessary to make the etching endpoint of the target wafer W2 ahead than a reference time point.

In the etching of the target wafer W2, the signal processor 28 detects the first maximal value generation time point t31 in the intensity of the interference light, and the controller 29 compares t31 with the reference time point t11. If it is determined that t31 is ahead of t11, the controller 29 adjusts an etching process time of the target wafer W2 such that the etching of the target wafer W2 is terminated at a time point obtained by subtracting a time difference between the first maximal value generating time point t31 and the reference time point t11 from the reference time point t_end for the etching endpoint of the target wafer W. Accordingly, after the etching is terminated, the depths of the recesses 130 and 132 of the target wafer W and the target wafer W2 may become equal to each other.

A method of controlling etching process condition using an etching controlling apparatus of an etching system according to example embodiments will be described with reference to FIGS. 1 and 2 and FIGS. 9 to 12.

Figure 9:
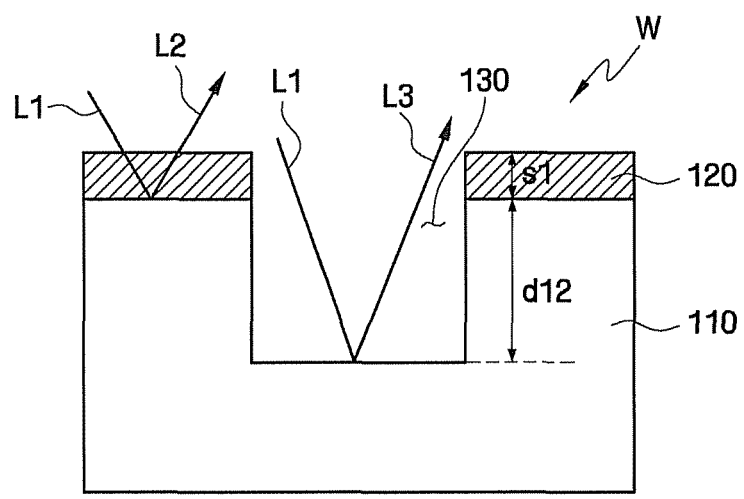
FIG. 9 is a cross-sectional view illustrating a target wafer at a time point when a second extreme value is generated in etching the target wafers shown in FIGS. 3, 5 and 7.

FIGS. 9 to 12 illustrate a method of uniformly controlling etching process condition depths in etching processes having different etch rates using time points of generating an extreme value two times in a case where an extreme value in the intensity of interference light is generated two or more times. FIG. 9 is a cross-sectional view illustrating a target wafer at a time point when a second extreme value is generated in etching the target wafers shown in FIGS. 3, 5 and 7, and FIGS. 10 to 12 are graphs illustrating a change in the intensity of interference light over time in etching the target wafer shown in FIG. 7.

Figure 10:
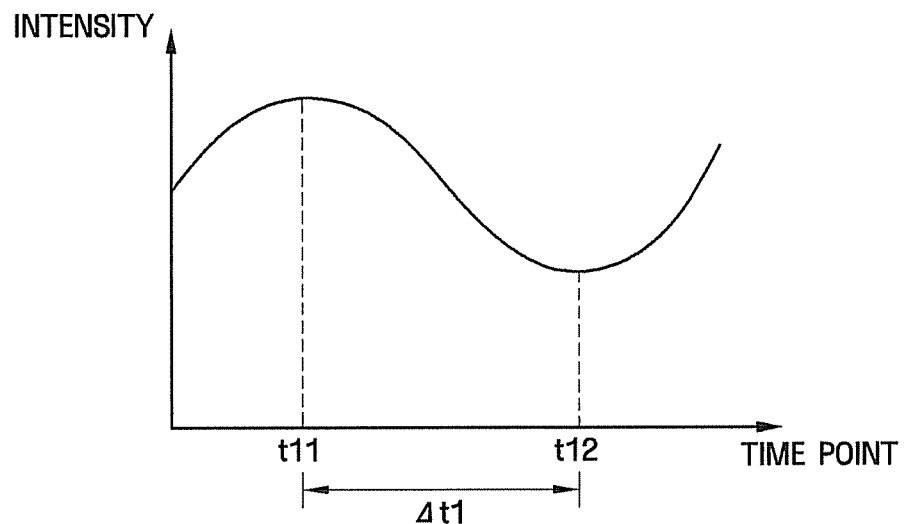
FIGS. 10 to 12 are graphs illustrating a change in the intensity of interference light over time in etching the target wafers as shown in FIGS. 3, 5, and 7.

Referring to FIGS. 1, 9 and 10, if etching of the target wafer W is continued, an extreme value in the intensity of the interference light generated by interference between the first reflected light L2 and the second reflected light L3 may be generated two or more times. A time point detected by the signal processor 28, at which a first extreme value, e.g., a first maximal value, in the intensity of the interference light is generated, is t11, and a time point detected by the signal processor 28, at which a second extreme value, e.g., a first minimal value, of the intensity of the interference light is generated, is t12.

As described above, at the time point of generating the first maximal value in the intensity of the interference light of the first reflected light L2 and the second reflected light L3, the depth (d11 of FIG. 3) ranging from the interface between the mask pattern 120 and the to-be-etched layer 110 and the surface of the to-be-etched layer 110 exposed by the mask pattern 120 and etched is equal for each target wafer W. At the time point of generating the second extreme value in the intensity of the interference light of the first reflected light L2 and the second reflected light L3, the depth (d12 of FIG. 9) ranging from the interface between the mask pattern 120 and the to-be-etched layer 110 and the surface of the to-be-etched layer 110 exposed by the mask pattern 120 and etched is also equal for each target wafer W.

Therefore, if etching processes have different etch rates, time differences between the first extreme value generating time point and the second extreme value generating time point are different in the etching processes. Based on this finding, as shown in FIGS. 9 to 12, depths of a recess varying due to the different etch rates after etching is terminated can be controlled in a real time basis.

Referring to FIGS. 9 and 10, the signal processor 28 detects a time point at which an extreme value in the intensity of the interference light of the first reflected light L2 and the second reflected light L3 is generated. Time points at which first and second extreme values of the intensity of the interference light are generated, as detected by the signal processor 28 in the course of etching the target wafer W shown in FIG. 3, are t11 and t12. Here, t11 becomes a reference time point for the time point at which the first extreme value in the intensity of the interference light is generated, and t12 becomes a reference time point for the time point at which the second extreme value in the intensity of the interference light is generated. A time difference t12 and t11 is $\Delta t1$, which is a reference value in the time difference between the first extreme value generating time point and the second extreme value generating time point. A reference time point for a time point at which the etching is terminated after the etching is performed to a desired depth is t_end.

Figure 11:
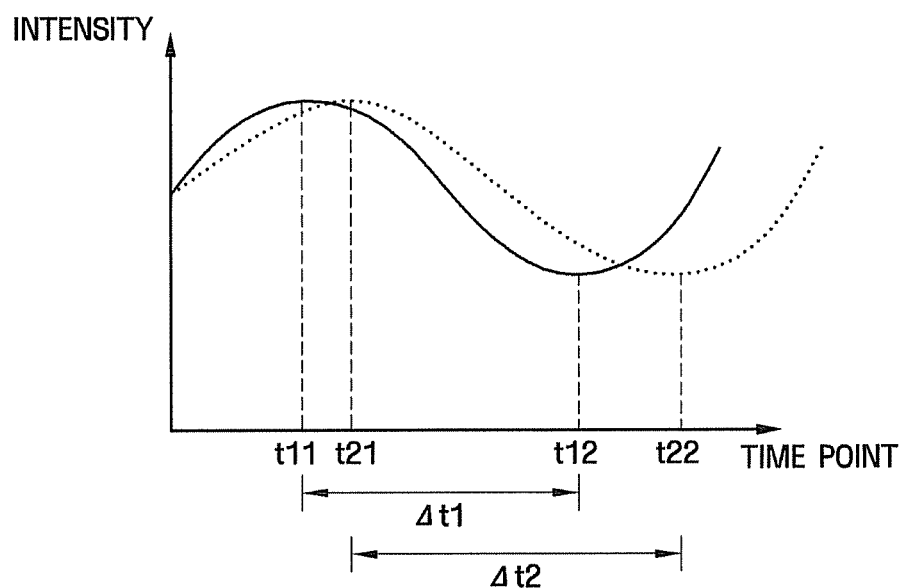

Referring to FIGS. 1, 5 and 11, a method of controlling the etching of the target wafer W1 shown in FIG. 5 will be described with regard to a time point t22 of generating the second extreme value in the intensity of the interference light, as detected by the signal processor 28, by way of example. The signal processor 28 detects a time point t21 of generating the first extreme value in the intensity of the interference light and the time point t22 of generating the second extreme value in the intensity of the interference light. The controller 29 compares t21 with a reference time point t11, and compares t22 with t12. In addition, the controller 29 compares a time difference $\Delta t2$ between t22 and t21 with a time difference $\Delta t1$ between t12 and t11.

If the time difference $\Delta t2$ is greater than the time difference $\Delta t1$, an etch rate in the etching of the target wafer W1 is lower than an etch rate in the etching of the target wafer (W of FIG. 9). In this case, in order to maintain uniformity in depths of recesses formed in the target wafer W1 after the etching is terminated, it is necessary to make the etching endpoint of the target wafer W1 be behind the reference etching endpoint or to adjust the etch rate to be relatively high by changing a flow rate of gas, power supply or a pressure.

In etching the target wafer W1, the controller 29 compares t21 with the reference time point t11 and compares t22 with t12. In addition, the controller 29 compares a time difference $\Delta t2$ between t22 and t21 with a time difference $\Delta t1$ between t12 and t11. If the time difference $\Delta t2$ is greater than the time difference $\Delta t1$, the controller 29 adjusts the process condition such that the etching endpoint of the target wafer W1 is behind the reference etching endpoint t_end of the target wafer W or adjusts the etch rate to be relatively high by changing a process condition such as a gas flow rate, power supply or a pressure. Accordingly, recesses 130 and 131 formed in the target wafer W and the target wafer W1 may have the same depth after the etching is terminated.

Figure 12:
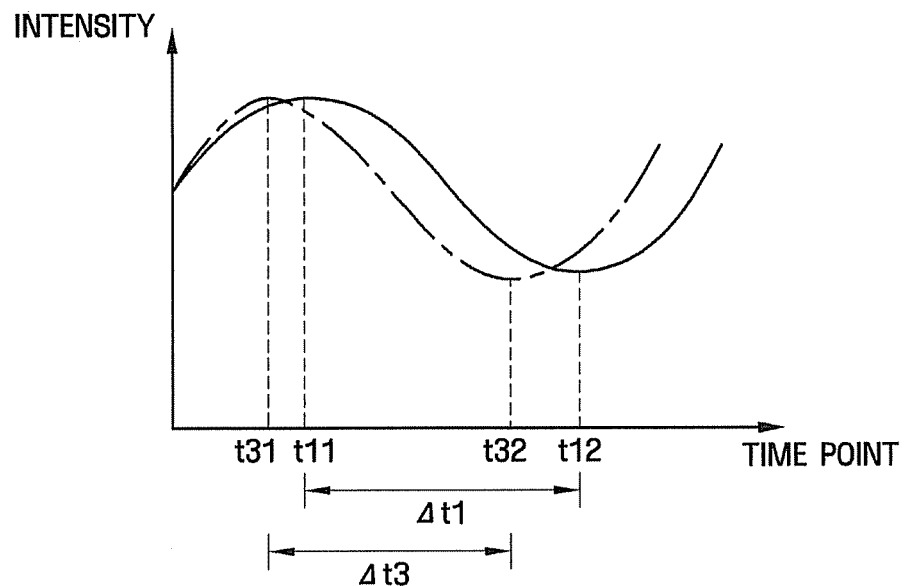

Referring to FIGS. 1, 7 and 12, a method of controlling the etching process condition of the target wafer W2 shown in FIG. 7 will be described with regard to a time point t32 of generating a second extreme value in the intensity of the interference light, as detected by the signal processor 28, by way of example. The signal processor 28 detects the time point t31 of generating the first extreme value in the intensity of the interference light and the time point t32 of generating the second extreme value in the intensity of the interference light. The controller 29 compares t31 with the reference time point t11, and compares t32 with t12. In addition, the controller 29 compares a time difference $\Delta t3$ between t32 and t31 with a time difference $\Delta t1$ between t12 and t11.

If the time difference $\Delta t3$ is smaller than the time difference $\Delta t1$, an etch rate in the etching of the target wafer W2 is higher than an etch rate in the reference etching, that is, the etching of the target wafer (W of FIG. 9). In this case, in order to maintain uniformity in depths of recesses formed in the target wafer W1 after the etching is terminated, it is necessary to make the etching endpoint of the target wafer W2 ahead of the reference etching endpoint or to adjust the etch rate to be relatively low by changing a flow rate of gas, power supply or a pressure.

In the etching of the target wafer W2, the controller 29 compares t31 with the reference time point t11 and compares t32 with t12. In addition, the controller 29 compares the time difference $\Delta t3$ between t32 and t21 with the time difference $\Delta t1$ between t12 and t11. If the time difference $\Delta t3$ is smaller than the time difference $\Delta t1$, the controller 29 adjusts the process condition such that the etching endpoint of the target wafer W2 is ahead of the reference etching endpoint t_end of the target wafer W or adjusts the etch rate to be relatively low by changing a process condition such as a gas flow rate, power supply or a pressure. Accordingly, recesses 130 and 131 formed in the target wafer W and the target wafer W2 may have the same depth after the etching is terminated.

Figure 13:
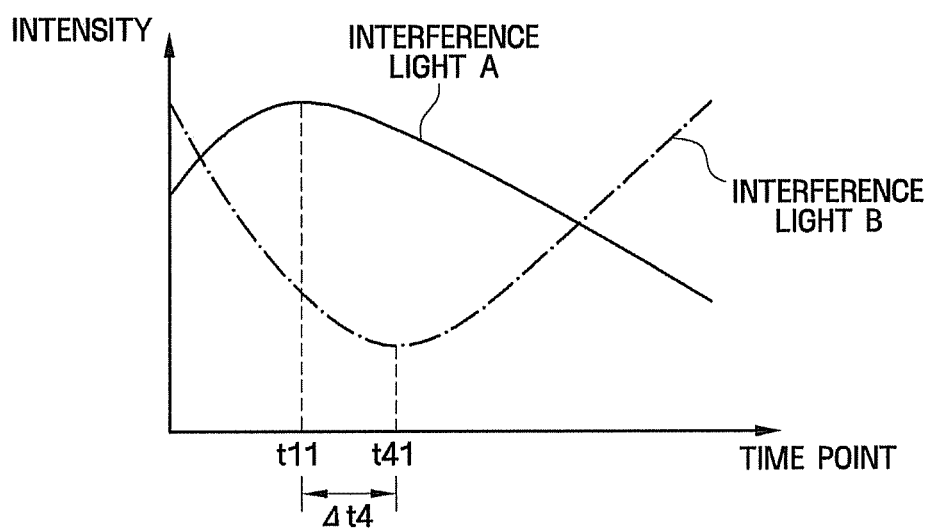
FIG. 13 is a graph illustrating a change in the intensity of interference light having different wavelengths over time.

A method of controlling etching process condition using an etching controlling apparatus of the etching system according to example embodiments will now be described with reference to FIG. 13. FIG. 13 is a graph illustrating a change in the intensity of interference light having different wavelengths over time.

As shown in FIGS. 10 to 12, in order to enable interference light having an extreme value generated therefrom two times to be observed with respect to one wavelength, a light path difference between reflected light L2 and reflected light L3 should be ½ or greater of the wavelength of the observed interference light. In addition, in order to enable signal processing for detecting an extreme value, additional time margin is preferably provided before and after the extreme value. Therefore, in a case where a depth of a to-be-etched layer etched is not sufficiently long, there may not be interference light having an extreme value generated two times therefrom. In this case, as shown in FIG. 13, two interference light beams having different wavelengths are used.

Referring to FIGS. 1 and 13, in the etching of the target wafer W shown in FIG. 3, the signal processor 28 detects extreme value generation time points in intensities of interference light A and interference light B having different wavelengths by interference between reflected light L2 and reflected light L3. A time point detected by the signal processor 28, at which a first extreme value in the intensity of the interference light A is generated, is t11. A time point, at which a first extreme value in the intensity of the interference light B is generated, is t41. Here, t11 becomes a reference time point for the time point at which the first extreme value in the intensity of the interference light A is generated, and t41 becomes a reference time point for the time point at which the first extreme value in the intensity of the interference light B is generated.

At the time point of generating the first extreme value in the intensity of the interference light A, a depth ranging from the interface between the mask pattern 120 and the to-be-etched layer 110 and the surface of the to-be-etched layer 110 etched is equal for each target wafer W, irrespective of the thickness of the mask pattern 120 or the process condition. At the time point of generating the first extreme value in the intensity of the interference light B, a depth ranging from the interface between the mask pattern 120 and the to-be-etched layer 110 and the surface of the to-be-etched layer 110 etched is also equal for each target wafer W, irrespective of the thickness of the mask pattern 120 or the process condition.

Therefore, if etching processes have different etch rates, time differences between the first extreme value generating time point in the intensity of interference light A and the second extreme value generating time point in the intensity of interference light B are different in the etching processes. Based on this finding, depths of a recess varying due to the different etch rates after etching is terminated can be controlled in a real time basis.

As previously described with reference to FIGS. 10 to 12, the signal processor 28 detects extreme value generation time points in intensities of interference light A and interference light B, and the controller 29 compares the first extreme value generation time point in the intensity of the interference light A with the reference time point t11, in each etching process, and compares the first extreme value generation time point in the intensity of the interference light B with the reference time point t41. In addition, the controller 29 compares a time difference between the first extreme value generation time point in the intensity of the interference light A and the first extreme value generation time point in the intensity of the interference light B with a time difference $\Delta t4$ between t41 and t11.

If the time difference between the first extreme value generation time point in the intensity of the interference light A and the first extreme value generation time point in the intensity of the interference light B is greater than a reference value, that is, the time difference $\Delta t4$, an etch rate in a pertinent etching process is lower than an etch rate in a reference etching process. In this case, in order to maintain uniformity in depths of recesses formed in the target wafer after the etching is terminated, it is necessary to make the etching endpoint of the target wafer be behind the reference etching endpoint or to adjust the etch rate to be relatively low by changing a flow rate of gas, power supply or a pressure. However, if the time difference between the first extreme value generation time point in the intensity of the interference light A and the first extreme value generation time point in the intensity of the interference light B is smaller than the time difference $\Delta t4$, an etch rate in a pertinent etching process is higher than the etch rate in the reference etching process. In this case, in order to maintain uniformity in depths of recesses formed in the target wafer after the etching is terminated, the controller 29 controls the etching endpoint of the target wafer to be behind the reference etching endpoint or adjusts the etch rate to be relatively low by changing a flow rate of gas, power supply or a pressure. Accordingly, recesses formed in the respective target wafers may have the same depth after the etching is terminated.

Figure 14:
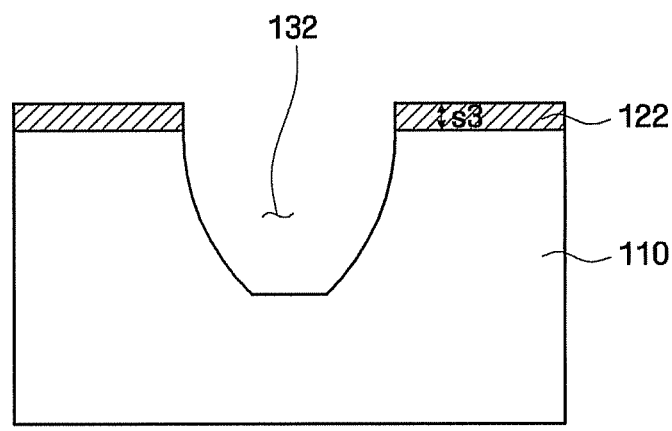
FIG. 14 is a cross-sectional view illustrating a target wafer having an etched surface of a to-be-etched layer exhibiting a bowing profile.

A method of controlling etching process condition using an etching controlling apparatus of the etching system according to example embodiments will now be described with reference to FIG. 14. FIG. 14 is a cross-sectional view illustrating a target wafer having an etched surface of an etched layer exhibiting a bowing profile.

Referring to FIG. 14, if a thickness s3 of a mask pattern 122 is smaller than a thickness s1 of the mask pattern (120 of FIG. 3) of the reference etching process, lateral etching of a recess 132 is heightened, so that an etched surface of the recess 132 may have a bowing profile. As previously described with reference to FIGS. 2 to 8, based on the finding that first extreme value generation time points of intensities of interference light are different in etching target wafers having mask patterns of different thicknesses, if the first extreme value generating time point of the interference light is ahead of a time point of the reference etching process, that is, if the mask pattern has a thickness smaller than a reference thickness, the process condition, including a flow rate of gas, power supply or a pressure, may be adjusted to a relatively low level, thereby controlling a profile of the recess 132.

While the present invention has been particularly shown and described with reference to example embodiments thereof, it will be understood by those of ordinary skill in the art that various changes in form and details may be made therein without departing from the spirit and scope of the present invention as defined by the following claims. It is therefore desired that example embodiments be considered in all respects as illustrative and not restrictive, reference being made to the appended claims rather than the foregoing description to indicate the scope of the invention.

What is claimed is:

1. An etching system comprising:
a light source configured to irradiate incident light into a target wafer;
a light intensity measuring unit configured to measure intensities of interference light, the interference light being generated from light beams reflected from the target wafer when the incident light is irradiated thereon, the interference light having a wavelength;
a signal processor configured to detect a time point at which an extreme value in the intensities is generated; and
a controller configured to compare the time point detected by the signal processor with a reference time point corresponding to the time point detected by the signal processor and control a process condition according to the comparison result.

2. The etching system of claim 1, wherein the time point detected by the signal processor is the time point at which a differential value in the intensity of the interference light with respect to the time point becomes about zero (0) and the extreme value in the intensities is a value of the intensity at this time point.

3. The etching system of claim 2, wherein the signal processor is configured to detect a time point at which a first maximal value in the intensities of the interference light is generated.

4. The etching system of claim 3, wherein the controller is configured to compare the time point of the first maximal value with the reference time point and control an etching endpoint according to the comparison result.

5. The etching system of claim 4, wherein the controller is configured to control the etching endpoint such that etching is terminated at a time point obtained by summing the reference time point for an etching endpoint and a time difference between the time point of the first maximal value and the reference time point if the time point of the first maximal value of the interference light is behind the reference time point.

6. The etching system of claim 4, wherein the controller is configured to control the etching endpoint such that etching is terminated at a time point obtained by subtracting a time difference between the reference time point and the time point of the first maximal value from the reference time point for an etching endpoint if the time point of the first maximal value of the interference light is behind the reference time point.

7. The etching system of claim 2, wherein the signal processor is configured to detect a first extreme value generating time point and a second extreme value generating time point in the intensities of the interference light having a same wavelength.

8. The etching system of claim 7, wherein the controller is configured to
compare the first and second extreme value generating time points in the intensities of the interference light with reference time points corresponding to the first and second extreme value generating time points,
compare a time difference between the first extreme value generating time point and the second extreme value generating time point with a time difference between the corresponding reference time points, and
adjust the process condition according to the comparison results.

9. The etching system of claim 8, wherein the controller is configured to control an etching endpoint to be behind the corresponding reference time point if the time difference between the first extreme value generating time point and the second extreme value generating time point is greater than the time difference between the corresponding reference time points.

10. The etching system of claim 8, wherein the controller is configured to control the etching endpoint to be ahead of the corresponding reference time point if the time difference between the first extreme value generating time point and the second extreme value generating time point is smaller than the time difference between the corresponding reference time points.

11. The etching system of claim 7, wherein a light path difference between the reflected light beams is greater than half (½) of the wavelength of the interference light.

12. The etching system of claim 1, wherein the controller is configured to:
detect a first extreme value generating time point and a second extreme value generating time point in the intensities of the interference light;
compare a first extreme value and a second extreme value generating time points in the intensities of the interference light with reference time points corresponding to the first and second extreme value generating time points;
compare a time difference between the first extreme value generating time point and the second extreme value generating time point with a time difference between the corresponding reference time points; and
adjust the process condition according to the comparison results.

13. The etching system of claim 12, wherein the first extreme value generating time point and the second extreme value generating time point in the intensities of the interference light have a same wavelength.

14. The etching system of claim 13, wherein the first extreme value generating time point and the second extreme value generating time point in the intensities of the interference light have a different wavelength.

15. An etching system comprising:
a light source configured to irradiate incident light into a target wafer;
a light intensity measuring unit configured to measure light intensity according to a wavelength of interference light generated by interference between reflected light beams from the target wafer;
a signal processor configured to detect a first time point at which a first extreme value in an intensity of first interference light having a first wavelength is generated and a second time point at which a second extreme value in an intensity of second interference light having a second wavelength different from the first wavelength is generated; and
a controller configured to compare a time difference between the first and second time points with corresponding reference time points and control a process condition according to the comparison result.

16. The etching system of claim 15, wherein the signal processor is configured to detect a time point at which a first extreme value in the intensity of the first interference light and the second interference light is generated.

17. The etching system of claim 16, wherein the controller is configured to
compare a time difference between first extreme value generating time points in the intensities of the first interference light and the second interference light with reference time points corresponding to the first and second extreme value generating time points,
compare a time difference between the first extreme value generating time point and the second extreme value generating time point with a time difference between the corresponding reference time points, and
adjust an etching endpoint according to the comparison results.

18. An etching system comprising:
a light source configured to irradiate light into a target wafer;
a light intensity measuring unit configured to measure light intensity of at least one interference light generated by reflected light beams from the target wafer;
a signal processor configured to detect a time point corresponding to an extreme value of light intensity of the at least one interference light; and
a controller configured to compare the time point corresponding to the extreme value of light intensity detected from the signal processor with a second time point and control a process condition according to the comparison result.

19. The etching system of claim 18, wherein the second time point is a reference time point corresponding to the time point that corresponds to the extreme value of light intensity of the at least one interference light.

20. The etching system of claim 18, wherein
the at least one interference light includes a first interference light and a second interference light each having a different wavelength,
the time point corresponding to the extreme value of light intensity of the at least one interference light corresponds to a time point of an extreme value of light intensity of the first interference light and the second time point corresponds to a time point of an extreme value of light intensity of the second interference light, and
the controller compares a time difference between the time point of the extreme value of light intensity of the first interference light and the time point of the extreme value of light intensity of the second interference light with corresponding reference time points.

* * * * *